(12) United States Patent
Blackmer et al.

(10) Patent No.: US 11,746,004 B2
(45) Date of Patent: Sep. 5, 2023

(54) LOW-PARASITIC CAPACITANCE MEMS INERTIAL SENSORS AND RELATED METHODS

(71) Applicant: Analog Devices, Inc., Wilmington, MA (US)

(72) Inventors: Charles Blackmer, Londonderry, NH (US); Jeffrey A. Gregory, Malden, MA (US); Nikolay Pokrovskiy, Billerica, MA (US); Bradley C. Kaanta, Belmont, MA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 17/668,326

(22) Filed: Feb. 9, 2022

(65) Prior Publication Data

US 2022/0162059 A1    May 26, 2022

Related U.S. Application Data

(62) Division of application No. 16/457,865, filed on Jun. 28, 2019, now Pat. No. 11,279,614.

(51) Int. Cl.
*B81C 1/00* (2006.01)
*G01C 19/5755* (2012.01)
*G01P 15/08* (2006.01)

(52) U.S. Cl.
CPC ...... *B81C 1/00063* (2013.01); *B81C 1/00166* (2013.01); *G01C 19/5755* (2013.01);
(Continued)

(58) Field of Classification Search
CPC ............ B81C 1/00063; B81C 1/00166; G01C 19/5755; G01P 15/0802
See application file for complete search history.

(56) References Cited

U.S. PATENT DOCUMENTS

| 5,659,195 A | 8/1997 | Kaiser et al. |
| 5,814,554 A | 9/1998 | De Samber et al. |

(Continued)

FOREIGN PATENT DOCUMENTS

| CN | 102062662 B | 10/2012 |
| CN | 102759636 A | 10/2012 |
| CN | 106586943 A | 4/2017 |

OTHER PUBLICATIONS

International Search Report and Written Opinion dated Oct. 19, 2020 in connection with International Application No. PCT/US2020/037837.

(Continued)

*Primary Examiner* — Peter M Albrecht
(74) *Attorney, Agent, or Firm* — Wolf, Greenfield & Sacks, P.C.

(57) ABSTRACT

Microelectromechanical system (MEMS) inertial sensors exhibiting reduced parasitic capacitance are described. The reduction in the parasitic capacitance may be achieved by forming localized regions of thick dielectric material. These localized regions may be formed inside trenches. Formation of trenches enables an increase in the vertical separation between a sense capacitor and the substrate, thereby reducing the parasitic capacitance in this region. The stationary electrode of the sense capacitor may be placed between the proof mass and the trench. The trench may be filled with a dielectric material. Part of the trench may be filled with air, in some circumstances, thereby further reducing the parasitic capacitance. These MEMS inertial sensors may serve, among other types of inertial sensors, as accelerometers and/or gyroscopes. Fabrication of these trenches may involve lateral oxidation, whereby columns of semiconductor material are oxidized.

20 Claims, 9 Drawing Sheets

(52) U.S. Cl.
CPC .. *G01P 15/0802* (2013.01); *B81B 2201/0235* (2013.01); *B81B 2201/0242* (2013.01)

(56) References Cited

U.S. PATENT DOCUMENTS

| | | |
|---|---|---|
| 6,172,401 B1 | 1/2001 | Brand |
| 6,214,696 B1 | 4/2001 | Wu |
| 6,239,473 B1 | 5/2001 | Adams et al. |
| 6,433,401 B1 | 8/2002 | Clark et al. |
| 6,461,888 B1 | 10/2002 | Sridhar et al. |
| 6,626,039 B1 | 9/2003 | Adams et al. |
| 7,121,141 B2 | 10/2006 | McNeil |
| 7,138,694 B2 | 11/2006 | Nunan et al. |
| 7,430,909 B2 | 10/2008 | Adams et al. |
| 9,758,368 B2 | 9/2017 | Gogoi |
| 11,279,614 B2 | 3/2022 | Blackmer et al. |
| 2001/0013630 A1 | 8/2001 | Cho et al. |
| 2005/0032266 A1 | 2/2005 | Suzuki |
| 2005/0066728 A1 | 3/2005 | Chojnacki et al. |
| 2005/0110110 A1 | 5/2005 | Blanchard et al. |
| 2008/0142912 A1 | 6/2008 | Inaba et al. |
| 2009/0174040 A1 | 7/2009 | Gogoi et al. |
| 2009/0289313 A1 | 11/2009 | Yamazaki |
| 2011/0140228 A1* | 6/2011 | Wang ................. H01L 29/0657 257/506 |
| 2012/0204642 A1 | 8/2012 | McNeil et al. |
| 2014/0306323 A1 | 10/2014 | Larsen et al. |
| 2016/0090295 A1 | 3/2016 | Tsai et al. |
| 2016/0131680 A1 | 5/2016 | Sugimoto et al. |
| 2018/0095106 A1 | 4/2018 | Sugimoto et al. |
| 2018/0246257 A1 | 8/2018 | Genier et al. |
| 2020/0407217 A1 | 12/2020 | Blackmer et al. |

OTHER PUBLICATIONS

Mason, MEMS Overview. Michigan State University. ECE 410 VLSI Design. Spring 2008. 16 pages. Retrieved from the Internet URL: [https://www.egr.msu.edu/classes/ece410/mason/files/MEMS%20overview.pdf]. Last accessed Sep. 13, 2019.

Wang et al., Deep Trench Capacitor Drive of a 3.3 GHz Unreleased Si MEMS Resonator. IEDM 2012. IEEE. 2012;15.1.1-15.1.4.

Yong et al., Fabrication of Ultra Deep Electrical Isolation Trenches with High Aspect Ratio Using D RIE and Dielectric Refill. Chinese Journal of Semiconductors. Jan. 2005; 26(1):17-21.

Partial Supplementary European Search Report dated Jun. 23, 2023 in connection with European Application No. 20830816.3.

* cited by examiner

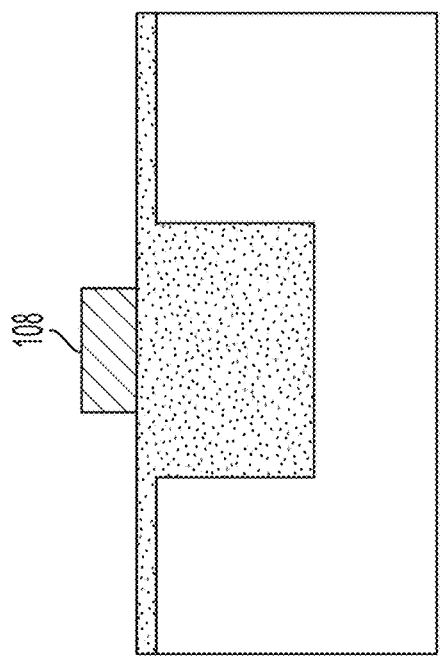
FIG. 4E
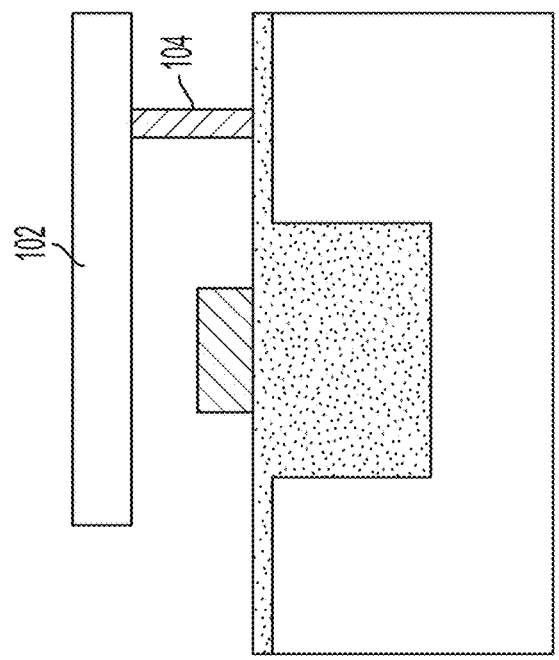
FIG. 4F
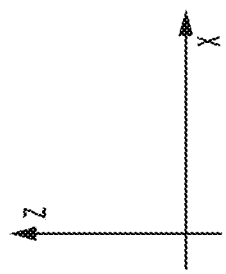

LOW-PARASITIC CAPACITANCE MEMS INERTIAL SENSORS AND RELATED METHODS

CROSS-REFERENCE TO RELATED APPLICATION

This application is a divisional claiming the benefit of U.S. application Ser. No. 16/457,865, filed Jun. 28, 2019, entitled "LOW-PARASITIC CAPACITANCE MEMS INERTIAL SENSORS AND RELATED METHODS," which is hereby incorporated herein by reference in its entirety.

FIELD OF THE DISCLOSURE

The technology described in the present application relates to microelectromechanical system (MEMS) inertial sensors, such as accelerometers and gyroscopes.

BACKGROUND

Inertial sensors are electronic devices that measure and report motion, forces, angular rates, and/or other quantities. Examples of inertial sensors include gyroscopes and accelerometers. MEMS gyroscopes detect angular motion by sensing acceleration produced by a Coriolis force, which arises when the gyroscope's resonant mass undergoes angular motion. MEMS accelerometers detect linear and/or angular acceleration.

SUMMARY OF THE DISCLOSURE

According to an aspect of the present application, microelectromechanical system (MEMS) inertial sensors exhibiting reduced parasitic capacitance are provided. The reduction in the parasitic capacitance may be achieved by forming localized regions of thick dielectric material. These localized regions may be formed inside trenches. Formation of trenches enables an increase in the vertical separation between a sense capacitor and the substrate, thereby reducing the parasitic capacitance in this region. The stationary electrode of the sense capacitor may be placed between the proof mass and the trench. The trench may be filled with a dielectric material. Part of the trench may be filled with air, in some circumstances, thereby further reducing the parasitic capacitance. These MEMS inertial sensors may serve, among other types of inertial sensors, as accelerometers and/or gyroscopes. Fabrication of these trenches may involve lateral oxidation, whereby columns of semiconductor material are oxidized.

According to another aspect of the present application, a MEMS inertial sensor is provided. The MEMS inertial sensor may comprise a substrate; a proof mass coupled to the substrate; a trench formed in the substrate, the trench being filled at least partially with a dielectric material, the trench at least partially overlapping with the proof mass along a direction perpendicular to a first surface of the substrate; and an electrode formed over the trench, the electrode and the proof mass forming a sense capacitor configured to sense motion of the proof mass relative to the substrate in response to acceleration of the MEMS inertial sensor.

According to another aspect of the present application, a MEMS inertial sensor is provided. The MEMS inertial sensor may comprise a substrate having a first surface; a proof mass coupled to the substrate; a trench formed in the substrate; a dielectric layer disposed on the first surface of the substrate; a dielectric material region disposed in the trench, the dielectric material region being thicker than the dielectric layer with respect to a direction perpendicular to the first surface of the substrate; and an electrode formed over the trench.

According to another aspect of the present application, a method for fabricating a MEMS inertial sensor is provided. The method may comprise etching a substrate to form a plurality of columns of semiconductor material spaced from one another by a plurality of interstices including a first interstice; oxidizing the plurality of columns of semiconductor material to fill at least a portion of the first interstice with an oxide material; forming an electrode over the oxide material; and forming a proof mass suspended over the substrate.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

FIGS. 4A-4F are schematic diagrams collectively illustrating an example of a process for fabricating a MEMS inertial sensor, according to some non-limiting embodiments.

DETAILED DESCRIPTION

Figure 1:
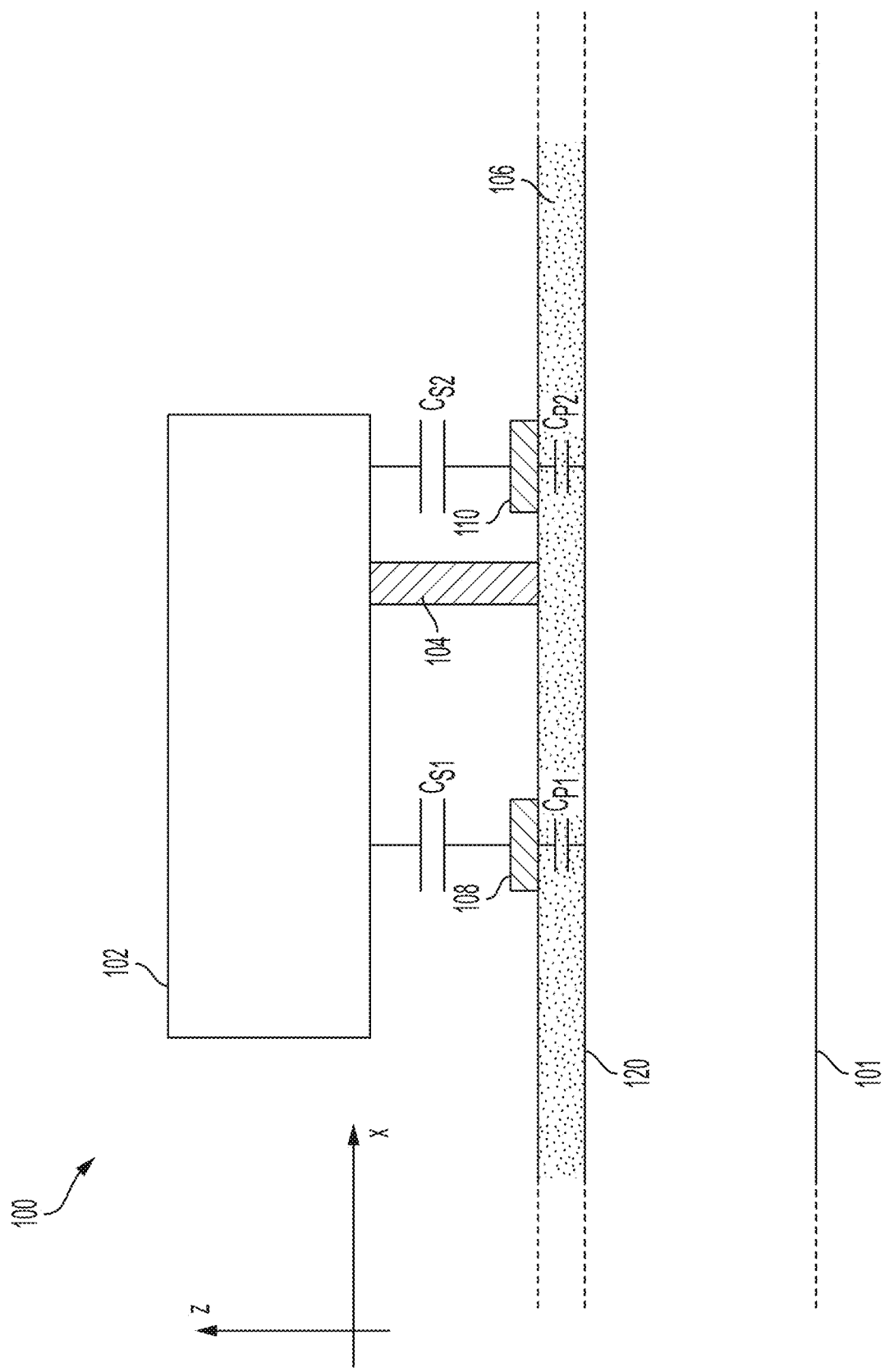
FIG. 1 is a schematic diagram illustrating an example of a MEMS inertial sensor, according to some non-limiting embodiments.

Applicant has appreciated that the sensitivity with which certain inertial sensors detect physical quantities, such as acceleration or rate of rotation, can be negatively affected by noise arising due to the presence of parasitic capacitances. The impact of parasitic capacitances on the sensitivity of inertial sensors is particularly harmful in those inertial sensors that rely on sense capacitors to detect the quantity to be measured. In these inertial sensors, in fact, noise picked up by a parasitic capacitance is to some extent indistinguishable from the electric signals generated by a sense capacitor in response to the quantity to be measured (e.g., acceleration or rate of rotation). The result is that the inertial sensor is less sensitive to the quantity to be measured, thus limiting its usefulness.

Applicant has appreciated that parasitic capacitances can arise in certain inertial sensors due to the presence of a substrate underneath the sense capacitors. In particular, parasitic capacitances arise in the region between the sense capacitors and the substrate. This region is sometimes occupied by a thin layer of dielectric material deposited on the top surface of the substrate. Examples of parasitic capacitance include "backside capacitance" and "substrate capacitance."

Aspects of the present application relate to MEMS inertial sensors in which the parasitic capacitance is reduced by forming localized regions of thick dielectric material. In some embodiments, such localized regions of thick dielectric material are formed between the sense capacitors and the underlying substrate.

In some embodiments, localized regions of thick dielectric material are formed inside trenches formed in the substrate under the sense capacitors. Applicant has appreciated that the presence of a trench in the substrate under a sense capacitor effectively increases the vertical separation between the substrate and the sense capacitor, resulting in a reduction of the capacitance. These trenches may be filled, partially or completely, with a dielectric material. For example, in inertial sensors that are formed on semiconductor substrates (e.g., silicon), a trench may be filled with silicon oxide or other types of oxides, or silicon nitride, among other examples. In other embodiments, a trench may be filled with air, the dielectric constant of which is lower than the dielectric constant of dielectric materials, thus further reducing the parasitic capacitance.

Applicant has appreciated one challenge associated with the formation of localized regions of thick dielectric material which stems from the relatively low rate with which dielectric materials are grown over semiconductor substrates. Consider for example the oxidation of silicon along the 100 direction, in which it takes about four hours at 1200° C. to obtain a 0.4 µm-thick silicon oxide layer. At this rate, it can take excessively long periods of time to grow a silicon oxide layer sufficiently thick to reduce the parasitic capacitance of a sensor to an acceptable level. This approach is unfeasible as it increases manufacturing lead times and, as a result, manufacturing costs.

Aspects of the present application relate to MEMS inertial sensors designed to reduce the parasitic capacitance while at the same time containing lead times and manufacturing costs. To increase the rate at which regions of thick dielectric material are formed, in some embodiments, the trenches are designed such that, when a dielectric material is formed therein, the growth occurs at least partially in the lateral direction. As described in detail further below, causing the dielectric material to grow along the lateral direction can speed up the rate at which a trench is filled (whether fully or partially).

Lateral dielectric growth may be achieved, in some embodiments, by forming a plurality of columns of semiconductor material in a substrate, and by causing the columns to oxidize (partially or completely). In this way, the oxidation advances laterally in the interstices between the columns. If the columns of semiconductor material are placed sufficiently close to one another, the distance that the dielectric material has to travel before closing off the interstices is short, thereby reducing the time necessary to form a region of thick dielectric material.

FIG. 1 is a schematic diagram illustrating an example of a MEMS inertial sensor, according to some non-limiting embodiments. Inertial sensor 100 is formed on substrate 101, and includes proof mass 102, anchor 104, dielectric layer 106 and electrodes 108 and 110.

Substrate 101 may be made of any suitable material including but not limited to silicon or other semiconductor materials. Proof mass 102 may be made of, among other materials, undoped silicon, polysilicon, doped silicon, or a combination of these. Proof mass 102 may be conductive, or at least have conductive portions. For example, the surface of proof mass 102 facing substrate 101 may be conductive. In some embodiments, proof mass 102 may comprise a mixture of materials, such as a dielectric material (or undoped silicon) with a conductive shell (e.g., doped silicon, aluminum or copper). Anchor 104 may be made of the same material as proof mass 102 or a different material. Anchor 104 couples proof mass 102 to substrate 101. Anchor 104 may be formed as a vertical post on substrate 101 (as illustrated in FIG. 1), or may be part of a frame to which proof mass 102 is attached.

Dielectric layer 106 may be made of any suitable dielectric material including but not limited to silicon oxide or other types of oxides, silicon nitride, or a combination of these. Electrodes 108 and 110 may be made of any conductive material including copper and aluminum, among others. Conductive traces (not shown in FIG. 1) may be used for routing electric signals between MEMS inertial sensor 100 and other electronic circuits formed on substrate 101. Similar to electrodes 108 and 110, the conductive traces may be deposited on top of dielectric layer 106. The conductive traces may be routed to bond pads, which may be wire bonded to electronic circuits formed on chips other than substrate 101. However, in some embodiments, such electronic circuits may be formed on substrate 101.

As shown in FIG. 1, dielectric layer 106 is formed over top surface 120 of substrate 101. In this example, top surface 120 lies in the xy-plane, though not all embodiments are limited to this arrangement.

MEMS inertial sensor 100 may serve, among other types of inertial sensors, as an accelerometer or at least part of an accelerometer, and/or as a gyroscope or at least part of a gyroscope. For example, inertial sensor 100 may sense acceleration directed along the z-axis by sensing the extent to which the proof mass 102 tilts out-of-plane (e.g., tilts away from a plane defined by the top surface of the proof mass 102, which lies in the xy-plane in the example of FIG. 1). Z-axis acceleration may arise in response to a variety of possible causes, including for example Coriolis forces or more simply motion of the inertial sensor along the z-axis. The extent to which the proof mass tilts out-of-plane may be sensed by sensing the extent to which the capacitance of one or more sense capacitors varies. In the example of FIG. 1, sense capacitors $C_{S1}$ and $C_{S2}$ can be used for this purpose.

Capacitor $C_{S1}$ is formed between electrode 108 and proof mass 102 and capacitor $C_{S2}$ is formed between electrode 110 and proof mass 102. Electrodes 108 and 110 are stationary (e.g., are constrained to move rigidly with the substrate 101) while proof mass 102 is free to move with respect to the substrate 101. In the example of FIG. 1, capacitors $C_{S1}$ and $C_{S2}$ are configured to sense out-of-plane motion of proof mass 102 differentially. For example, when proof mass 102 tilts clockwise in the xz-plane, the separation between proof mass 102 and electrode 110 reduces, thus increasing the capacitance of sense capacitor $C_{S2}$, and the separation between proof mass 102 and electrode 108 increases, thus reducing the capacitance of sense capacitor $C_{S1}$. Likewise, when proof mass 102 tilts counterclockwise in the xz-plane, the separation between proof mass 102 and electrode 110 increases, thus reducing the capacitance of sense capacitor $C_{S2}$, and the separation between proof mass 102 and electrode 108 reduces, thus increasing the capacitance of sense capacitor $C_{S1}$. The capacitance of the sense capacitors $C_{S1}$ and $C_{S2}$ can be expressed, in some embodiments, in terms of the separation between the respective electrodes and proof mass 102. For example, the capacitance of $C_{S1}$ can be expressed according to the following expression $C_{S1} = \varepsilon_0 \varepsilon_1 A_1/d_1$, where $\varepsilon_0$ is the vacuum permittivity, $\varepsilon_1$ is the relative dielectric constant of the material between the terminals of the capacitor $C_{S1}$, $A_1$ is the area of the capacitor $C_{S1}$ and $d_1$ is the separation between electrode 108 and proof mass 102. A similar expression applies to $C_{S2}$.

As further shown in FIG. 1, parasitic capacitances are formed through dielectric layer 106 between the sense capacitors and the underlying substrate 101. For example, parasitic capacitance $C_{p1}$ arises between electrode 108 and substrate 101 and parasitic capacitance $C_{p2}$ arises between electrode 110 and substrate 101. Thus, electrode 108 and substrate 101 can be viewed as the terminals of capacitance $C_{p1}$ and electrode 110 and substrate 101 can be viewed as the terminals of capacitance $C_{p2}$. These parasitic capacitances contribute to noise in the detection circuit (not shown in FIG. 1) receiving signals generated by sense capacitors $C_{S1}$ and $C_{S2}$. This noise can negatively affect the inertial sensor's ability to accurately sense acceleration or rate of rotation. In some embodiments, in fact, the noise present at the detection circuit is proportional to the following quantity: $(C_{sense} + C_{parasitic} + C_{routing} + C_{amp})/(C_{sense})$, where $C_{sense}$ represents the overall capacitance of the sense capacitors, $C_{parasitic}$ represents the overall parasitic capacitance, $C_{routing}$ represents the overall capacitance associated with the conductive traces and $C_{amp}$ represents the input capacitance of the amplification stage of the detection circuit. Thus, the presence of the parasitic capacitance directly affects the noise at the detection circuit.

The parasitic capacitance can be expressed in terms of the separation between its terminals and the dielectric constant of the material between the terminals. For example, the capacitance of $C_{p1}$ can be expressed according to the following expression $C_{p1} = \varepsilon_0 \varepsilon_p A_p/d_p$, where $\varepsilon_p$ is the relative dielectric constant of the material between the terminals of the capacitor, $A_p$ is the area of the capacitor and $d_p$ is the separation between the terminals.

Aspects of the present application relate to techniques for reducing the noise present at the detection circuit of a MEMS inertial sensor owing to parasitic capacitances. In some embodiments, the parasitic capacitances shown in FIG. 1 may be reduced by increasing the separation between its terminals. For example, in some embodiments, the parasitic capacitance may be reduced by forming a trench in the substrate, and by filling the trench, partially or completely, with a dielectric material or with air.

Figure 2:
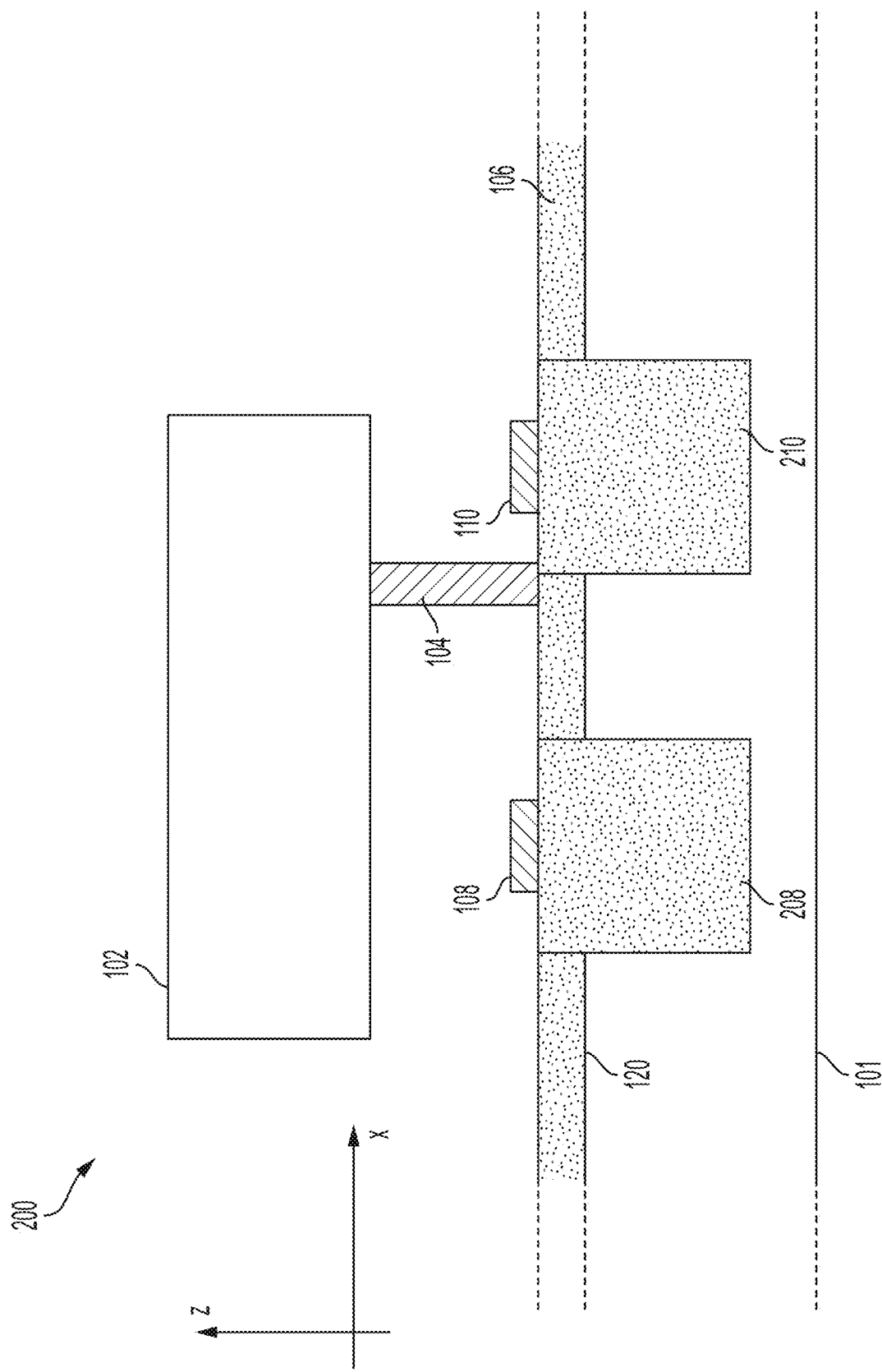
FIG. 2 is a schematic diagram illustrating an example of a MEMS inertial sensor with trenches formed in the substrate, according to some non-limiting embodiments.

An example of such an arrangement is illustrated in FIG. 2, according to some non-limiting embodiments. Similar to MEMS inertial sensor 100, MEMS inertial sensor 200 is formed on substrate 101, and includes proof mass 102, anchor 104, dielectric layer 106 and electrodes 108 and 110. MEMS inertial sensor 200 further includes trenches 208 and 210, which are formed in the substrate under electrodes 108 and 110.

Similar to MEMS inertial sensor 100, MEMS inertial sensor 200 may serve as, among other types of inertial sensors, an accelerometer or at least part of an accelerometer, and/or as a gyroscope or at least part of a gyroscope. For example, inertial sensor 200 may sense acceleration directed along the z-axis, though aspects of the present application are not limited in this respect as they may also be applied to inertial sensors configured to detect in-plane acceleration.

In some embodiments, as illustrated in FIG. 2, a trench may at least partially overlap with proof mass 102 along the z-axis. As a result, at least a portion of the trench is under proof mass 102. In some embodiments, an electrode may be placed between proof mass 102 and the corresponding trench along the z-axis. For example, as illustrated in FIG. 2, electrode 108 is placed between proof mass 102 and trench 208.

As described in detail below in connection with FIG. 3, trenches 208 and 210 are arranged to reduce the parasitic capacitances of the MEMS inertial sensor relative to $C_{p1}$ and $C_{p2}$ (see FIG. 1). Trenches 208 and 210 may be filled, partially or completely, with a dielectric material to provide mechanical stability, or may be filled with air. For example, in some embodiments, substrate 101 may be made of silicon and a trench may be filled with silicon oxide. Relative to the arrangement of FIG. 1, the arrangement of FIG. 2 effectively increases the vertical separation (in the z-axis) between the substrate and the sense electrodes, thus reducing the parasitic capacitance. The dielectric material filling the trenches 208 and 210 may be the same material used in dielectric layer 106 (e.g., silicon oxide) or may be a different material.

In some embodiments, part of the trenches 208 and 210 may be filled with air. Because air has a relative dielectric constant of about 1, filling part of the trench with air may lead to a further reduction of the parasitic capacitance.

In some embodiments, trenches of the types described herein may be formed in the substrate under the conductive traces (not shown in FIG. 2) used to route electric signals between MEMS inertial sensor 200 and other electronic circuits, thus reducing the parasitic capacitance associated with such conductive traces. Similar to trenches 208 and 210, these trenches may be filled, partially or completely, with at least one of dielectric material or with air.

Figure 3:
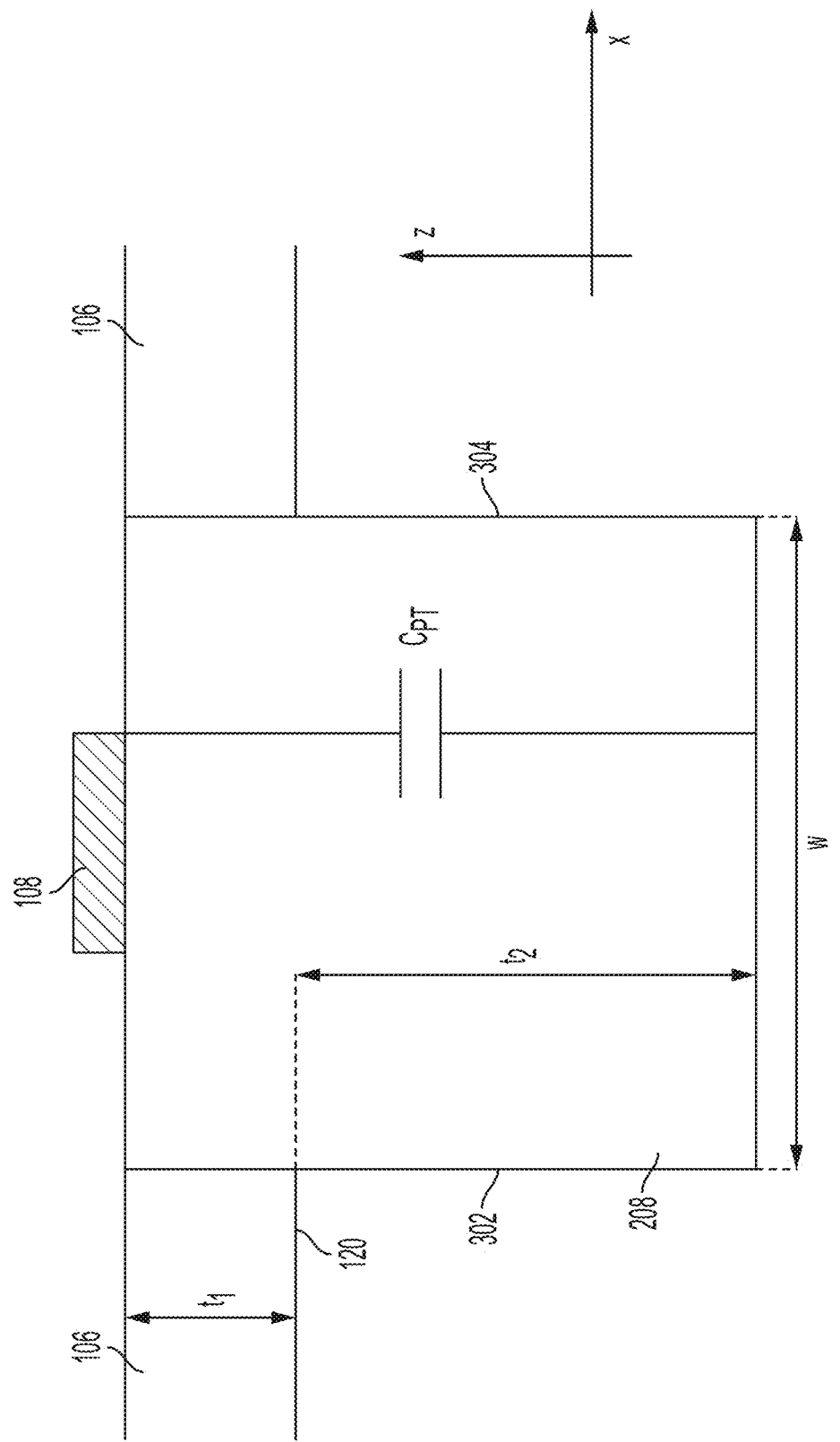
FIG. 3 is a schematic diagram illustrating a portion of the MEMS inertial sensor of FIG. 2 in additional detail, according to some non-limiting embodiments.

FIG. 3 is a schematic diagram illustrating a portion of the MEMS inertial sensor of FIG. 2 in additional detail, according to some non-limiting embodiments. In particular, FIG. 3 illustrates trench 208 in additional detail. Trench 210, not shown in FIG. 3, may have characteristics similar to those described in connection with FIG. 3. In some embodiments, trench 208 may be bounded in the xy-plane by sidewalls 302 and 304. In some embodiments, the sidewalls 302 and 304 may be substantially vertical (e.g., parallel to the z-axis, or angularly offset relative to the z-axis by 5° or less). Substantially vertical sidewalls may be obtained by etching the substrate with an anisotropic etch process, including for example reaction-ion etch (RIE). Use of anisotropic etching techniques enables the formation of trenches that are deeper than other types of recesses formed via isotropic etching techniques. Having deep trenches is desirable in some embodiments because it results in a greater separation between the terminals of the parasitic capacitance, and consequently in a lower capacitance. It should be appreciated, however, that isotropic etching techniques may be used in some embodiments for the formation of one or more trenches of the types described herein. It should be appreciated, however, that sidewalls 302 and 304 may be angled, relative to the z-axis, by any suitable amount as the application is not limited to substantially vertical sidewalls. In some embodiments, for example, trenches shaped as triangles, with sidewalls converging at the bottom of the trench, may be used.

In some embodiments, trench 208 may be filled, partially or completely, with a dielectric material. The dielectric material in the trench may be thicker (along the z-axis) than dielectric layer 106. In FIG. 3, the thickness of dielectric layer 106 ($t_1$) and the thickness of trench 208 ($t_2$) are defined in relation to the top surface 120 of substrate 101. Thicknesses $t_1$ and $t_2$ are referred to relative to the z-axis. The ratio $t_2/t_1$ may be between 1.5 and 100, between 1.5 and 50, between 1.5 and 25, between 1.5 and 10, between 1.5 and 5, between 2 and 100, between 2 and 50, between 2 and 25, between 2 and 10, between 2 and 5, between 5 and 100, between 5 and 50, between 5 and 25, between 5 and 10. Other ratios are also possible.

Thickness $t_1$ may be between 0.1 µm and 5 µm, between 0.5 µm and 5 µm, between 1 µm and 5 µm, between 2 µm and 5 µm, between 3 µm and 5 µm, between 4 µm and 5 µm, between 0.1 µm and 3 µm, between 0.5 µm and 3 µm, between 1 µm and 3 µm, between 2 µm and 3 µm, between 0.1 µm and 2 µm, between 0.5 µm and 2 µm, between 1 µm and 2 µm, between 0.1 µm and 1.5 µm, between 0.5 µm and 1.5 µm, between 1 µm and 1.5 µm, between 0.1 µm and 1 µm, between 0.5 µm and 1 µm, between 0.1 µm and 0.5 µm, between 0.5 µm and 1 µm. Other ranges outside such ranges are also possible. In some embodiments, there may be no dielectric layer 106 (such that $t_1=0$).

Thickness $t_2$ may be between 1 µm and 20 µm, between 2.5 µm and 20 µm, between 5 µm and 20 µm, between 7.5 µm and 20 µm, between 10 µm and 20 µm, between 15 µm and 20 µm, between 1 µm and 10 µm, between 2.5 µm and 10 µm, between 5 µm and 10 µm, between 7.5 µm and 10 µm, between 1 µm and 8 µm, between 2 µm and 8 µm, between 4 µm and 8 µm, between 6 µm and 8 µm, between 1 µm and 6 µm, between 2 µm and 6 µm, between 6 µm and 8 µm, between 1 µm and 4 µm, between 2 µm and 4 µm. Additionally, or alternatively, thickness $t_2$ may be greater than 20 µm, greater than 50 µm, greater than 100 µm, greater than 300 µm, greater than 500 µm, greater than 700 µm, but less than the overall thickness of substrate 101. Other ranges outside such ranges are also possible.

The width of trench 208 ($w$) in the x-axis and the y-axis may be between 1 µm and 400 µm, between 25 µm and 400 µm, between 50 µm and 400 µm, between 75 µm and 400 µm, between 100 µm and 400 µm, between 150 µm and 400 µm, between 1 µm and 200 µm, between 25 µm and 200 µm, between 50 µm and 200 µm, between 75 µm and 200 µm, between 1 µm and 100 µm, between 20 µm and 100 µm, between 40 µm and 100 µm, between 60 µm and 100 µm, between 1 µm and 50 µm, between 20 µm and 50 µm, between 30 µm and 50 µm, between 1 µm and 10 µm, between 5 µm and 10 µm. Other ranges outside such ranges are also possible. The width of trench 208 in the x-axis may be equal to or different than the width of trench 208 in the y-axis.

In the example of FIG. 3, the separation along the z-axis between electrode 108 and substrate 101 is $t_1+t_2$, which is greater than the separation between electrode 108 and top surface 120 in FIG. 1 by an amount equal to $t_2$. The result is that parasitic capacitance $C_{PT}$ is less than parasitic capacitance $C_{p1}$. This reduction in the parasitic capacitance associated with electrode 108 results in a reduction of the noise present at the detection circuit, thus resulting in an increase in the sensitivity of MEMS inertial sensor 200 to the quantity to be detected (e.g., acceleration and/or angular rate of motion).

In some embodiments, it may be desirable to form trench 208 to be very deep (e.g., with $t_2$ being greater than 3 µm) to decrease the capacitance significantly. However, Applicant has appreciated that forming a localized region of thick dielectric material may be challenging due to the relatively low growth rate of dielectric materials.

Applicant has appreciated that the time needed to form a localized region of thick dielectric material (like the one inside trench 208) can be substantially reduced by allowing, during the fabrication process, the dielectric material to grow in the lateral direction. Lateral dielectric growth may be achieved, in some embodiments, by forming a plurality of columns of semiconductor material in the substrate, and by oxidizing (partially or completely) the columns of semiconductor material. An example of such a fabrication process is illustrated in FIGS. 4A-4F, according to some non-limiting embodiments. It should be appreciated that fabrication processes of the types described herein are not limited to the order of FIGS. 4A-4F, as the order of some (or all) of these steps may be changed as needed.

Figure 4A:
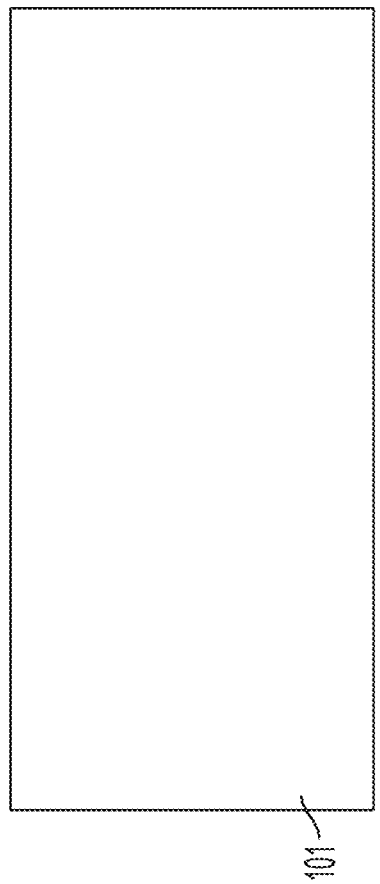

As shown in FIG. 4A, a substrate 101 is provided. Substrate 101 may be made of any suitable semiconductor material including for example silicon (doped or undoped), or polysilicon.

Figure 4B:
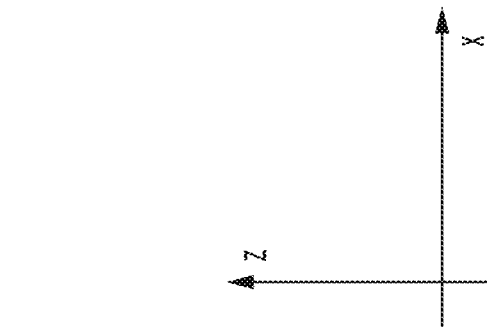
Figure 4B:
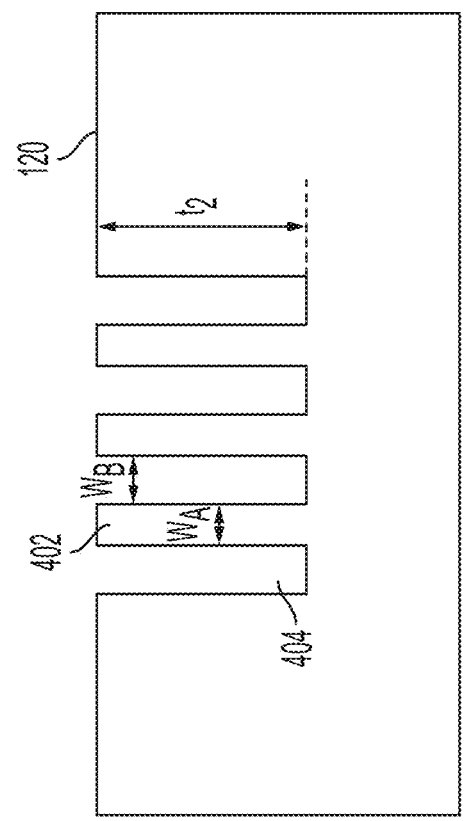

In the fabrication step of FIG. 4B, a plurality of columns 402 of semiconductor material are formed in substrate 101. Columns 402 may be elongated along the z-axis. Columns 402 may have any suitable shape, including cylindrical and rectangular, among others. The shape of the columns 402 may be regular (such that the width $W_A$ is constant along the z-axis) or may be irregular (such that the width $W_A$ varies along the z-axis). Columns 402 may be separated from one another by interstices 404. The interstices 404 may in some embodiments be filled with air. The shape of the interstices 404 may be regular (such that the width $W_B$ is constant along the z-axis) or may be irregular (such that the width $W_B$ varies along the z-axis). In some embodiments, interstices 404 and columns 402 may be formed by selectively etching (using photolithographic techniques) substrate 101. The selective etch may include an anisotropic etch, such as RIE. Interstices 404 may have depths in the z-axis relative to top surface 120 equal to $t_2$ (see FIG. 3).

Width $W_A$ may be between 0.1 µm and 5 µm, between 0.1 µm and 3 µm, between 0.1 µm and 2 µm, between 0.1 µm and 1 µm, between 0.5 µm and 2 µm, between 0.5 µm and 1 µm. Other ranges outside such ranges are also possible.

Width $W_B$ may be between 0.1 µm and 5 µm, between 0.5 µm and 3 µm, between 0.1 µm and 2 µm, between 0.1 µm and 1 µm, between 0.5 µm and 2 µm, between 0.5 µm and 1 µm. Other ranges outside such ranges are also possible.

Figure 4C:
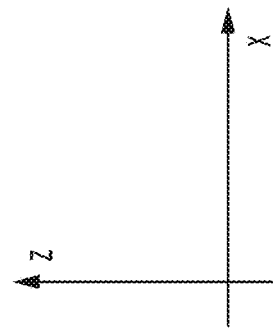
Figure 4C:
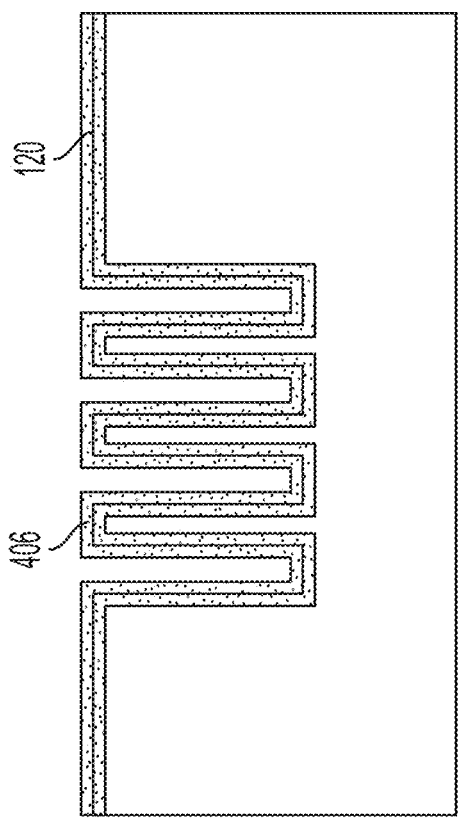
Figure 4D:
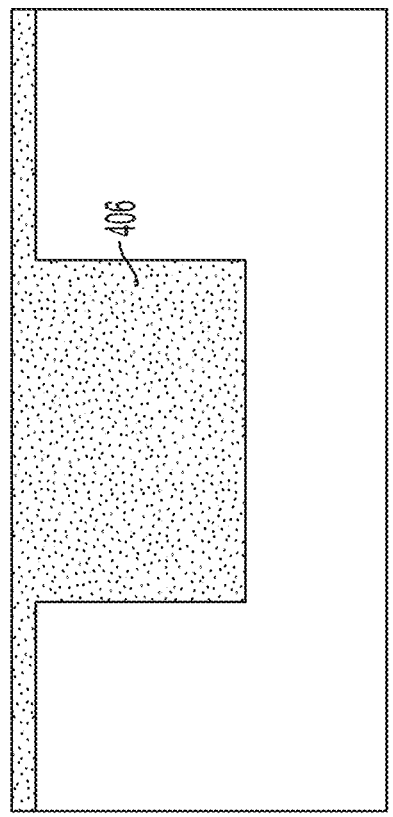
Figure 5:
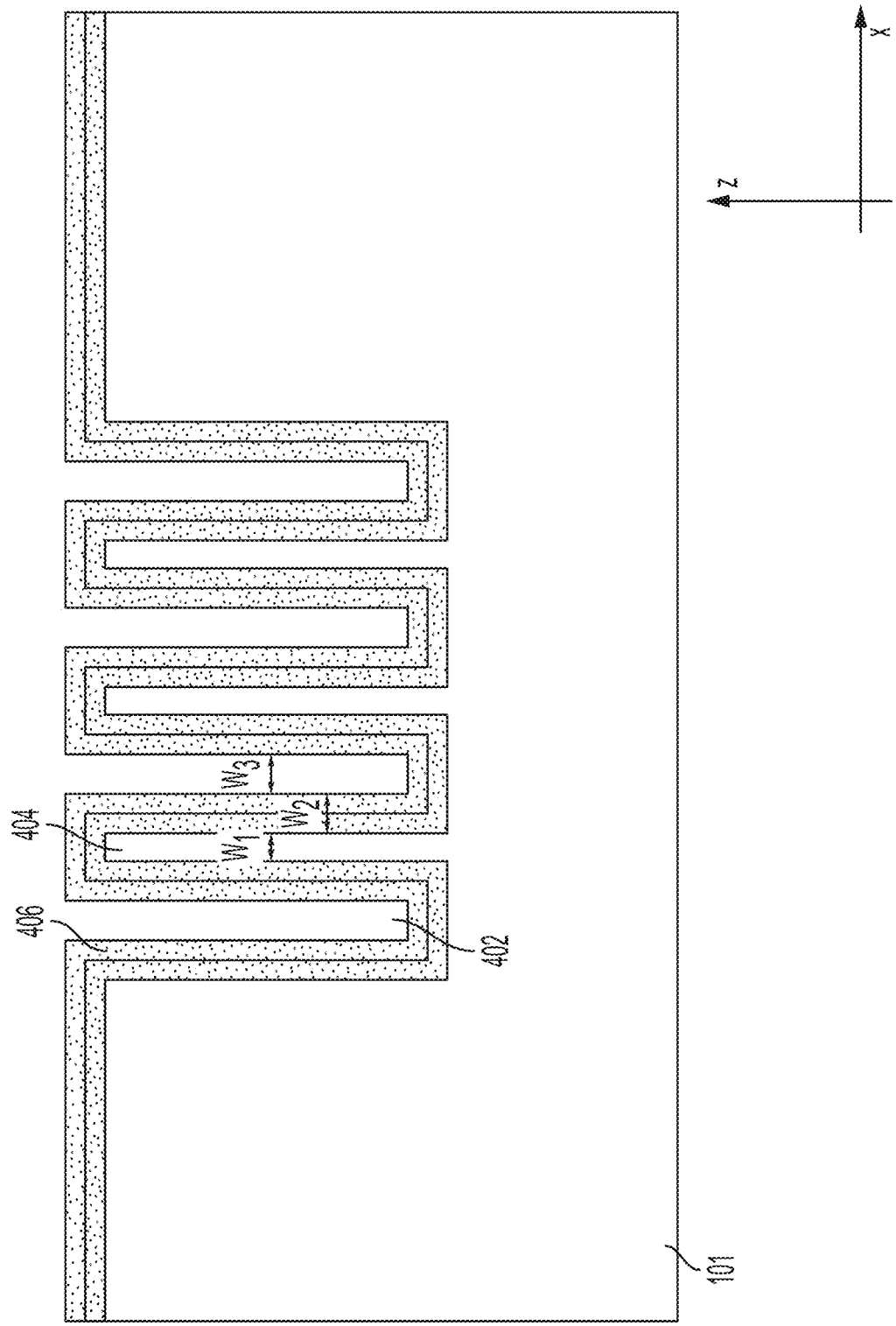
FIG. 5 is a schematic diagram illustrating an example of an inertial sensor with a trench having multiple columns of semiconductor material, according to some non-limiting embodiments.

In the fabrication step of FIG. 4C, a dielectric material 406 is formed. Dielectric material 406 may be formed, for example, by oxidizing the patterned substrate 101. Outside the etched region, and on top of columns 402, oxidation may occur in in the vertical direction (along the z-axis). Additionally, lateral oxidation (along the x-axis and/or the y-axis) may occur in the interstices 404. The lateral oxidation may occur due to the oxidation of the sidewalls of columns 402. As the oxide advances in the lateral direction, the widths $W_A$ and $W_B$ of columns 402 and interstices 404 reduce. This is because the oxide advances in two directions: from the sidewall of a column toward the center of the column (thus consuming part of the column), and from the sidewall of a column away from the center of the column (thus consuming part of the interstice). In some embodiments, the oxidation may proceed until the entirety of each column 402 and the entirety of each interstice 404 have been consumed by silicon oxide, as illustrated in FIG. 4D. In other embodiments, however, part of one or more interstices 404 and/or part of one or more columns 402 may remain un-oxidized. This scenario is illustrated in FIG. 5, in which the oxidation is stopped when the interstices 404 have reached a width $W_3$, the columns 402 have reached a width $W_1$, and the oxidized regions have reached a width $W_2$. Stopping the oxidation before the entirety of the region is consumed with oxide may be used in some embodiments so that the presence of air further reduces the parasitic capacitance. In some embodiments, for example, the thicknesses of the interstices 404 and columns 402 may be selected such that when the entirety of the columns have been consumed by oxide, there are still residual interstices that are left un-oxidized.

Different fabrication techniques may be used to form the dielectric layer 406. For example, in some embodiments, the dielectric layer may be formed via thermal oxidation (in a dry or wet environment), Plasma Enhanced Chemical Vapor Deposition (PECVD) (e.g., using Tetraethyl orthosilicate (TEOS) as a precursor), and Nitric Acid Oxidation of Silicon (NAOS). Among these, thermal oxides lead to lower levels of mechanical stress, given the high temperatures involved in the oxidation process, but the lead times may be longer.

It should be appreciated that, in some embodiments, dielectric layer 106 and the dielectric material inside the trenches of FIG. 3 may be formed simultaneously as part of the fabrication step of FIG. 4C. In other embodiments, however, dielectric layer 106 and the dielectric material inside the trenches of FIG. 3 may be formed separately.

Optionally, in the fabrication step of FIG. 4D, a planarization may be performed to planarize the top surface of the dielectric material. Possible planarization techniques include chemical mechanical polishing (CMP), thermal reflow, and deposition of an additional dielectric layer.

In the fabrication step of FIG. 4E, electrode 108 is formed. In some embodiments, electrode 108 is formed over the region of thick dielectric material, such that electrode 108 overlaps with the thick dielectric material along the z-axis. As shown in FIG. 2, electrode 108 may serve as a terminal of a sense capacitor. In some embodiments, conductive traces (not shown in FIG. 4E) are also patterned in the fabrication step of FIG. 4E.

In the fabrication step of FIG. 4F, anchor 104 and proof mass 102 are formed. In some embodiments, the formation of proof mass 102 involves the formation and release of a sacrificial layer. Proof mass 102 may be formed to overlap with the region of thick dielectric material, and to overlap with electrode 108, along the z-axis.

MEMS inertial sensors of the types described herein may be used as accelerometers to sense acceleration in one, two or three directions. Additionally, or alternatively, MEMS inertial sensor of the types described herein may be used as gyroscopes to sense angular rate of motion about one, two or three directions. Gyroscopes of these types may be configured to sense pitch and/or roll and/or yaw rates. When used as gyroscopes, MEMS inertial sensors of the types described herein may be coupled with circuits for causing oscillation of a resonant body. The resonant body may be proof mass 102 itself, or other parts of the MEMS inertial sensor.

As described above, a detection circuit may be coupled to the sense capacitors and may be configured to sense variations in the capacitances of these capacitors. In some embodiments, the detection circuit may be disposed on substrate 101. In other embodiments, the detection circuit may be disposed on a separate substrate, which may be bonded (e.g., wire bonded or flip-chip bonded) to substrate 101. These substrates may or may not be packaged within a common housing.

Figure 6:
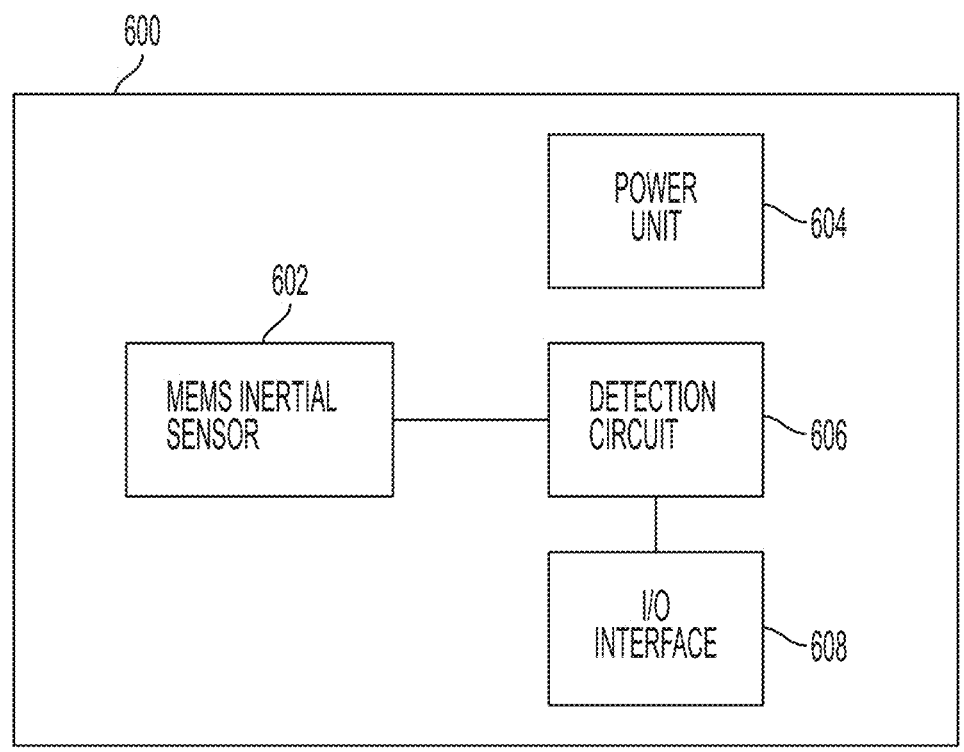
FIG. 6 is a block diagram illustrating an example of a system including a MEMS inertial sensor, according to some non-limiting embodiments.

FIG. 6 is a block diagram illustrating a system 600 comprising a MEMS inertial sensor 602, a power unit 604, detection circuit 606 and input/output (I/O) interface 608. MEMS inertial sensor 602 may comprise for example MEMS inertial sensor 200, and optionally, may be fabricated according to the steps of FIGS. 4A-4F. The MEMS inertial sensor may be configured for example to sense acceleration and/or angular rates of motion.

System 600 may periodically transmit, via wired connections or wirelessly, data representing sensed acceleration and/or angular rates to an external monitoring system, such as a computer, a smartphone, a tablet, a smartwatch, smartglasses, or any other suitable receiving device. I/O interface 608 may be configured to transmit and/or receive data via Wi-Fi, Bluetooth, Bluetooth Low Energy (BLE), Zigbee, Thread, ANT, ANT+, IEEE 802.15.4, IEEE 802.11.ah, or any other suitable wireless communication protocol. Alternatively, or additionally, I/O interface 608 may be configured to transmit and/or receive data using proprietary connectivity protocols. I/O interface 608 may comprise one or more antennas, such as a microstrip antenna. In some embodiments, I/O interface 608 may be connected to a cable, and may be configured to transmit and/or receive signals through the cable.

System 600 may be powered using power unit 604. Power unit 604 may be configured to power detection circuit 606, I/O interface 608, MEMS inertial sensor 602, or any suitable combination thereof. In some embodiments, power unit 604 may comprise one or more batteries. System 600 may, in at least some embodiments, consume sufficiently little power to allow for its operation for extended periods based solely on battery power. The battery or batteries may be rechargeable in some embodiments. Power unit 604 may comprise one or more lithium-ion batteries, lithium polymer (LiPo) batteries, super-capacitor-based batteries, alkaline batteries, aluminum-ion batteries, mercury batteries, dry-cell batteries, zinc-carbon batteries, nickel-cadmium batteries, graphene batteries or any other suitable type of battery. In some embodiments, power unit 604 may comprise circuitry to convert AC power to DC power. For example, power unit 604 may receive AC power from a power source external to system 600, such as via I/O interface 608, and may provide DC power to some or all the components of system 600. In such instances, power unit 604 may comprise a rectifier, a voltage regulator, a DC-DC converter, or any other suitable apparatus for power conversion.

Power unit 604 may comprise energy harvesting components and/or energy storage components, in some embodiments. Energy may be harvested from the surrounding environment and stored for powering the system 600 when needed, which may include periodic, random, or continuous powering. The type of energy harvesting components implemented may be selected based on the anticipated environment of the system 600, for example based on the expected magnitude and frequency of motion the system 600 is likely to experience, the amount of stress the system is likely to experience, the amount of light exposure the system is likely to experience, and/or the temperature(s) to which the system is likely to be exposed, among other possible considerations. Examples of suitable energy harvesting technologies include thermoelectric energy harvesting, magnetic vibrational harvesting, electrical overstress harvesting, photovoltaic harvesting, radio frequency harvesting, and kinetic energy harvesting. The energy storage components may comprise supercapacitors in some embodiments.

System 600 may be deployed in various settings to detect acceleration and/or angular rates (among other possible physical quantities) including sports, healthcare, consumer, military, and industrial applications, among others. Some non-limiting examples are now described. A system 600 may be a wearable sensor deployed in monitoring sports-related physical activity and performance, patient health, military personnel activity, or other applications of interest of a user. A system 600 may be disposed in a smartphone, and may be configured to sense roll, yaw and/or pitch rates and/or acceleration in one, two or three dimensions.

Figure 7:
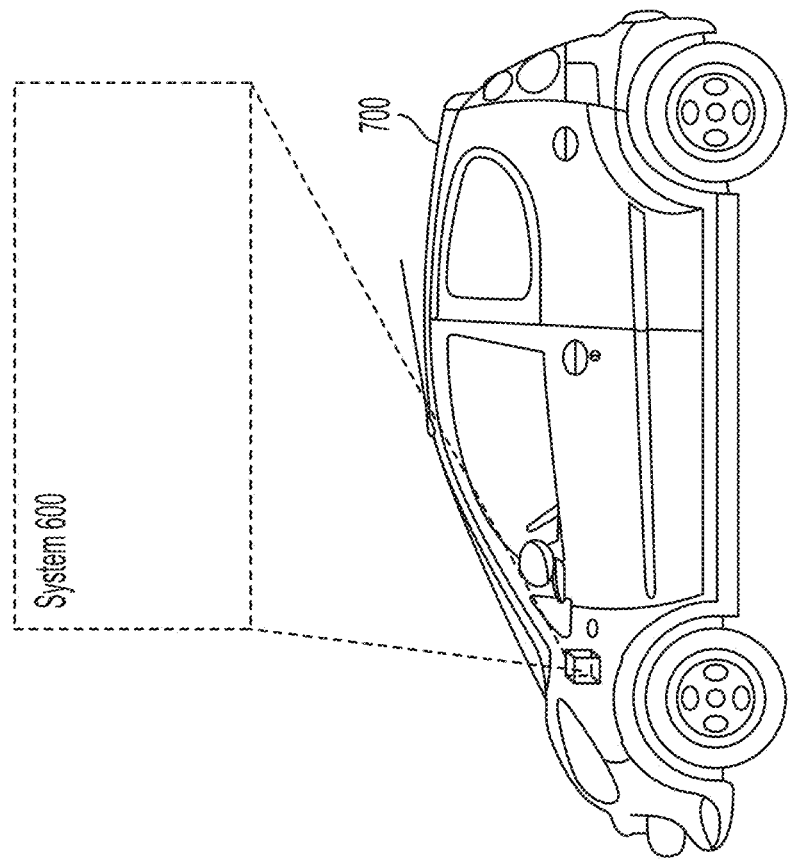
FIG. 7 is a schematic diagram illustrating a car including the system of FIG. 6, according to some non-limiting embodiments.

One such setting is in automobiles, or other vehicles, such as boats or aircrafts. FIG. 7 illustrates schematically a car 700 comprising a system 600. System 600 may be disposed in any suitable location of car 700. System 600 may be configured to sense roll, pitch and/or yaw rates and/or acceleration in one, two or three dimensions. System 600 may be configured to provide, using I/O interface 608, sensed angular rates and/or acceleration to a computer system disposed in car 700 and/or to a computer system disposed on a base station outside car 700. System 600 may provide information to a navigation system (including a self-driving system) mounted in car 700. Alternatively, or additionally, system 600 may provide information to an automatic steering system and/or to an automatic braking system.

Figure 8:
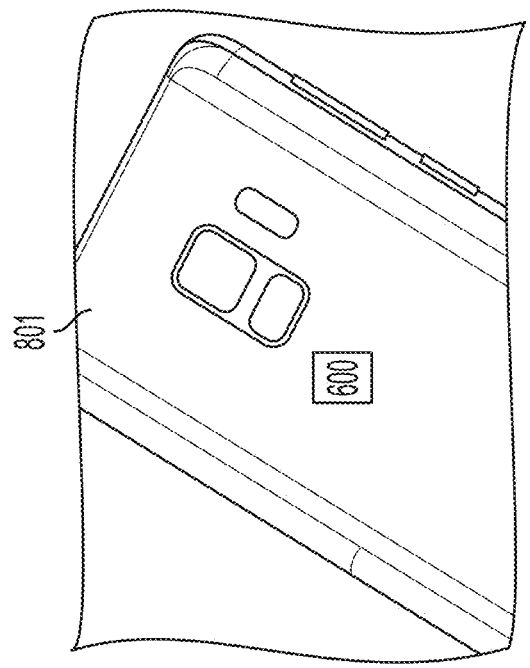
FIG. 8 is a schematic diagram illustrating a smartphone including the system of FIG. 6, according to some non-limiting embodiments.

A system 600 may be part of a wearable device in some embodiments. For example, system 600 may be mounted as part of an earbud, as part of a smartwatch, or as part of a smartphone 801 (as shown in FIG. 8). Other environments in which a system 600 may be deployed include tablets, laptops, smartglasses, medical devices, sports equipment, among many others.

Aspects of the technology described herein may provide one or more benefits, some of which have been previously described. Now described are some examples of such benefits. It should be appreciated that not all aspects and embodiments necessarily provide all of the benefits now described. Further, it should be appreciated that aspects of the technology described herein may provide additional benefits to those now described.

Aspects of the technology described herein provide MEMS inertial sensors with reduced parasitic capacitance, resulting in a reduction of the noise present at the detection circuit, resulting in an increase in the sensitivity of the inertial sensor to the physical quantity to be measured (e.g., acceleration and/or angular rate of motion). In some embodiments, the noise present in a MEMS inertial sensor of the types described herein is three times lower (or even less in some embodiments) than the noise present in other types of MEMS inertial sensors. Further aspects of the technology described herein provide low-cost techniques for fabricating low-parasitic capacitance MEMS inertial sensors.

The terms "approximately", "substantially," and "about" may be used to mean within ±20% of a target value in some embodiments, within ±10% of a target value in some embodiments, within ±5% of a target value in some embodiments, and within ±2% of a target value in some embodiments. The terms "approximately," "substantially," and "about" may include the target value.

What is claimed is:

1. A method for fabricating a microelectromechanical system (MEMS) inertial sensor, the method comprising:
    etching a substrate to form a plurality of columns of semiconductor material spaced from one another by a plurality of interstices including a first interstice;
    oxidizing the plurality of columns of semiconductor material to fill at least a portion of the first interstice with an oxide material;
    forming an electrode over the oxide material; and
    forming a proof mass suspended over the substrate.

2. The method of claim 1, wherein oxidizing the plurality of columns of semiconductor material comprises oxidizing the plurality of columns of semiconductor material to fill an entirety of the first interstice with the oxide material.

3. The method of claim 1, wherein etching the substrate to form the plurality of columns of semiconductor material comprises performing a deep reactive-ion etch.

4. The method of claim 1, wherein etching the substrate to form the plurality of columns of semiconductor material comprises etching the substrate to form the plurality of columns of semiconductor material with heights that are at least 3 µm.

5. The method of claim 1, wherein etching the substrate to form the plurality of columns of semiconductor material comprises etching the substrate to form the plurality of columns of semiconductor material with widths between 0.1 µm and 5 µm.

6. The method of claim 1, wherein etching the substrate to form the plurality of columns of semiconductor material comprises etching the substrate to form the plurality of columns of semiconductor material with substantially vertical sidewalls.

7. The method of claim 1, wherein etching the substrate to form the plurality of columns of semiconductor material comprises etching the substrate to form the plurality of columns of semiconductor material so that the first interstice has a width between 0.1 µm and 5 µm.

8. The method of claim 1, wherein oxidizing the plurality of columns of semiconductor material comprises performing Plasma Enhanced Chemical Vapor Deposition (PECVD).

9. The method of claim 8, wherein performing PECVD comprises using Tetraethyl orthosilicate (TEOS) as a precursor.

10. The method of claim 1, wherein oxidizing the plurality of columns of semiconductor material comprises performing Nitric Acid Oxidation of Silicon (NAOS).

11. The method of claim 1, further comprising forming an anchor extending perpendicularly relative to a top surface of the substrate, wherein forming the proof mass comprises forming the proof mass so that the proof mass is connected to the anchor.

12. The method of claim 1, wherein forming the proof mass comprises forming the proof mass over the electrode.

13. The method of claim 1, further comprising planarizing the substrate prior to forming the electrode.

14. A method for fabricating a microelectromechanical system (MEMS) inertial sensor, the method comprising:
    etching a top surface of a substrate to form a plurality of columns of semiconductor material so that:
        the plurality of columns of semiconductor material extend in a first direction perpendicular to the top surface, and
        the plurality of columns of semiconductor material are spaced from one another in a second direction by a plurality of interstices including a first interstice, wherein the second direction is perpendicular to the first direction;
    oxidizing the plurality of columns of semiconductor material at least in the second direction to fill at least a portion of the first interstice with silicon oxide;
    forming an electrode over the silicon oxide;
    forming an anchor extending perpendicularly relative to the top surface of the substrate; and
    forming a proof mass connected to the anchor and suspended over the electrode.

15. The method of claim 14, wherein oxidizing the plurality of columns of semiconductor material comprises oxidizing the plurality of columns of semiconductor material to fill an entirety of the first interstice with the silicon oxide.

16. The method of claim 14, wherein etching the top surface of the substrate to form the plurality of columns of semiconductor material comprises performing a deep reactive-ion etch.

17. The method of claim 14, wherein etching the top surface of the substrate to form the plurality of columns of semiconductor material comprises etching the top surface of the substrate to form the plurality of columns of semiconductor material with heights that are at least 3 μm.

18. The method of claim 14, wherein etching the top surface of the substrate to form the plurality of columns of semiconductor material comprises etching the top surface of the substrate to form the plurality of columns of semiconductor material with widths between 0.1 μm and 5 μm.

19. The method of claim 14, wherein oxidizing the plurality of columns of semiconductor material comprises performing plasma enhanced chemical vapor deposition (PECVD).

20. The method of claim 14, wherein oxidizing the plurality of columns of semiconductor material comprises filling the at least a portion of the first interstice with thermal silicon oxide.

* * * * *